US008153522B2

(12) United States Patent
Devilliers et al.

(10) Patent No.: US 8,153,522 B2
(45) Date of Patent: Apr. 10, 2012

(54) PATTERNING MASK AND METHOD OF FORMATION OF MASK USING STEP DOUBLE PATTERNING

(75) Inventors: Anton Devilliers, Boise, ID (US); Michael Hyatt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/716,071

(22) Filed: Mar. 2, 2010

(65) Prior Publication Data

US 2011/0217843 A1 Sep. 8, 2011

(51) Int. Cl.
*H01L 21/44* (2006.01)

(52) U.S. Cl. ......... 438/675; 257/E21.231; 257/E21.233; 257/E21.585; 430/312; 430/5

(58) Field of Classification Search .................. 438/675; 257/E21.231, E21.233
See application file for complete search history.

(56) References Cited

U.S. PATENT DOCUMENTS 6,934,007 B2 8/2005 Fritze et al.
7,247,574 B2 7/2007 Broeke et al.
2005/0221231 A1* 10/2005 Fritze et al. .................. 430/311
2007/0218673 A1 9/2007 Nakamura
2007/0238308 A1 10/2007 Niroomand et al.
2009/0142932 A1 6/2009 Jung

* cited by examiner

*Primary Examiner* — Alexander Ghyka
*Assistant Examiner* — Seahvosh Nikmanesh
(74) *Attorney, Agent, or Firm* — Dickstein Shapiro LLP

(57) ABSTRACT

A method of forming a mask for use in fabricating an integrated circuit includes forming first non-removable portions of a photoresist material through a mask having a plurality of apertures, shifting the mask, forming second non-removable second portions of the photoresist material overlapping the first portions, and removing removable portions of the photoresist material arranged between the first and second portions. The formed photoresist mask may be used to form vias in an integrated circuit. The pattern of vias produced have the capability to exceed the current imaging resolution of a single exposure treatment.

24 Claims, 19 Drawing Sheets

132

E E

120

PATTERNING MASK AND METHOD OF FORMATION OF MASK USING STEP DOUBLE PATTERNING

FIELD OF THE INVENTION

Embodiments described herein relate generally to the fabrication of integrated circuit masks, and more specifically to means for providing vias to form electrical connections to various features, such as spaced conductive lines in integrated circuits.

BACKGROUND OF THE INVENTION

Electrically conductive lines and connections form many common components of integrated circuits. Dynamic random access memory (DRAM) circuitry, for example, incorporates multiple parallel conductive lines to form word-lines and bit-lines, which must be connected to various components. In order to increase capacity and accommodate smaller devices, there is constant pressure to increase the density of components on these and other circuits. The continual reduction in feature size places greater demands on the techniques used to form the features.

Photolithography is a commonly used technique for patterning integrated circuit features, such as conductive lines and vias that may be filled with a conductive material to form a connection. One example of a photolithographic method for patterning integrated circuit features includes depositing a photoresist material over a material to be patterned, covering portions of the photoresist material with a mask, exposing the uncovered photoresist material to light, and etching away either the exposed portion, in the case of a positive resist, or the unexposed portion of the photoresist material, in the case of a negative resist. The remaining photoresist material is used as an etch mask for an etching process. In the etching process, portions of the of the material to be etched that are not covered by the photoresist material are removed by, for example, wet or dry chemical etch. After the etch, the remaining photoresist material is dissolved.

There are, however, limitations on how close features can be patterned using known photolithographic techniques. The size of features on an integrated circuit are conventionally described by their "pitch," which is the distance between an identical point on two neighboring features. Due to an inherent resolution limit, which is a function of a numerical aperture of the mask and the wavelength of the light used, there is a minimum pitch below which features cannot be reliably formed using conventional photolithographic techniques.

Thus, there exists a need for a method and apparatus to pattern closely spaced features having a smaller pitch than would be possible using a mask having a given resolution limit in a conventional photolithographic technique.

DETAILED DESCRIPTION OF THE INVENTION

The term "substrate" in the following description refers to any supporting material suitable for fabricating an integrated circuit, typically a semiconductor material, but not necessarily so. A substrate may be silicon-based, may include epitaxial layers of silicon supported by a base semiconductor foundation, can be sapphire-based, silicon-on-insulator (SOI), metal, polymer, quartz, or any other materials suitable for supporting an integrated circuit or mask formation. When reference is made to a semiconductor substrate in the following description, previous process steps may have been utilized to form regions or junctions in or over a base semiconductor or foundation. The terms "removable" and "non-removable" as used herein relate to portions of a material that either will be removed or will not be removed, respectively, by a subsequent step, for example by treating the material with a solvent.

In various embodiments described herein, a mask having a geometric pattern is used to conduct a first exposure of a photoresist material. Next, the mask undergoes a small image shift and a second exposure of the photoresist is performed. The first and second exposures overlap to yield a grid of non-exposed areas, which may be removed using a negative develop technique. In various embodiments, the non-exposed areas may be etched into vias to be used as electrical contacts. The pattern of vias produced has the capability to exceed the current resolution of a prior art single exposure treatment. These embodiments are particularly well suited for application to processor and memory technology such as dynamic random access memory (DRAM) and other memory devices that contain closely spaced access lines, for example, access lines and data/source lines, bit-lines, and to other integrated circuit structures having closely spaced parallel conductive lines. It should be understood that the embodiments discussed herein are not limited by the examples described herein and that changes can be made thereto.

Figure 1A:
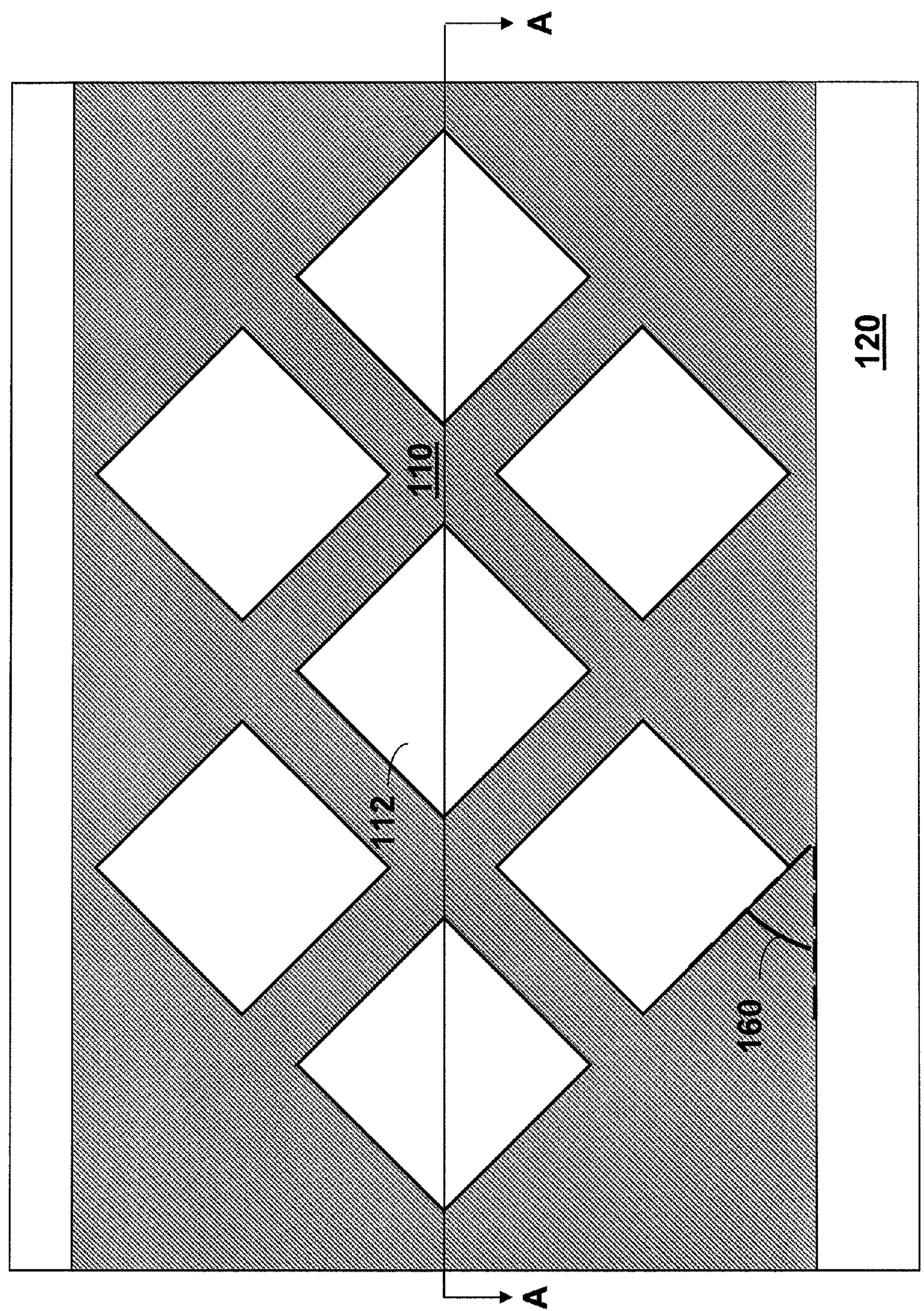
FIGS. 1A through 1M illustrate steps in a photolithographic method of forming vias in a substrate according to an embodiment described herein.
Figure 1B:
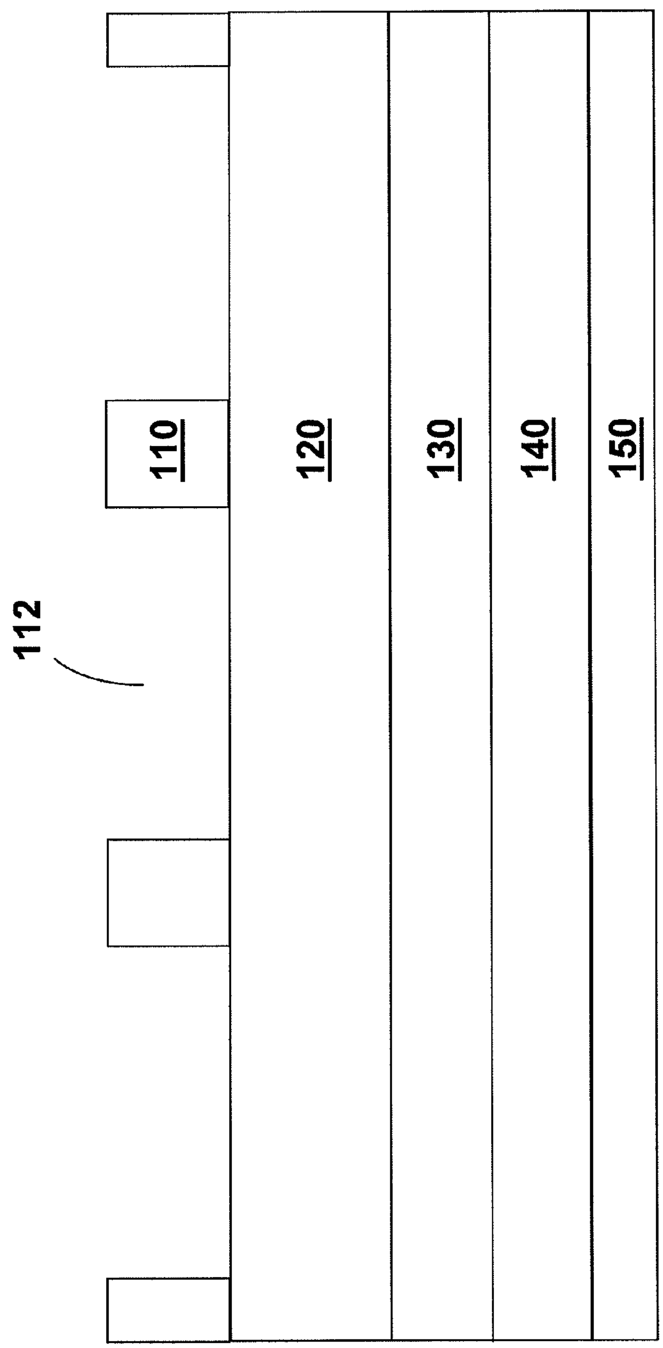

Example embodiments are now described with reference to the accompanying figures wherein like reference numbers are used consistently for like features throughout the drawings. FIGS. 1A-1M show steps in a method of making a grid of vias according to an embodiment described herein. FIGS. 1A and 1B illustrate a top down view and a cross-sectional view taken along line A-A, respectively, of a mask 110 arranged over a stack of materials including a substrate 150, a conductive material 140, such as a metal or a metal silicide, an insulating material 130, such as an oxide, and a negative photoresist material 120, such as SU-8. It should be understood that the materials described for FIGS. 1A and 1B are examples only and the stack could include any number of different materials used in the production of an integrated circuit.

The mask 110 includes a plurality of apertures 112 formed therein. In the embodiment shown in FIG. 1A, the apertures 112 are arranged as a grid of squares. In other embodiments, the apertures may have different geometric shapes, such as circles, triangles, and other polyhedrons and combinations thereof, including shapes having straight and curved lines. The apertures 112 may each have an identical shape, as shown in the Embodiment of FIG. 1A, or may have shapes different from each other. Although the mask 110 in the embodiment shown in FIG. 1A includes seven apertures 112, it should be understood that in various other embodiments the mask 110 may include any number of apertures 112 to produce a desired number of contacts. The apertures 112 may be arranged in groups having various spacing between them to form contacts at various locations on a single integrated circuit or on a number of integrated circuits arranged on a die. Furthermore, although the aperture grid shown in FIG. 1A is arranged at a forty-five degree angle 160 with reference to an edge of the mask 110, in other embodiments, the grid may be rotated to other angles. The sides of each aperture 112 may be parallel to the corresponding sides of every other aperture in the grid pattern, as shown in FIG. 1A, or may be arranged at angles different to each other.

Figure 1C:
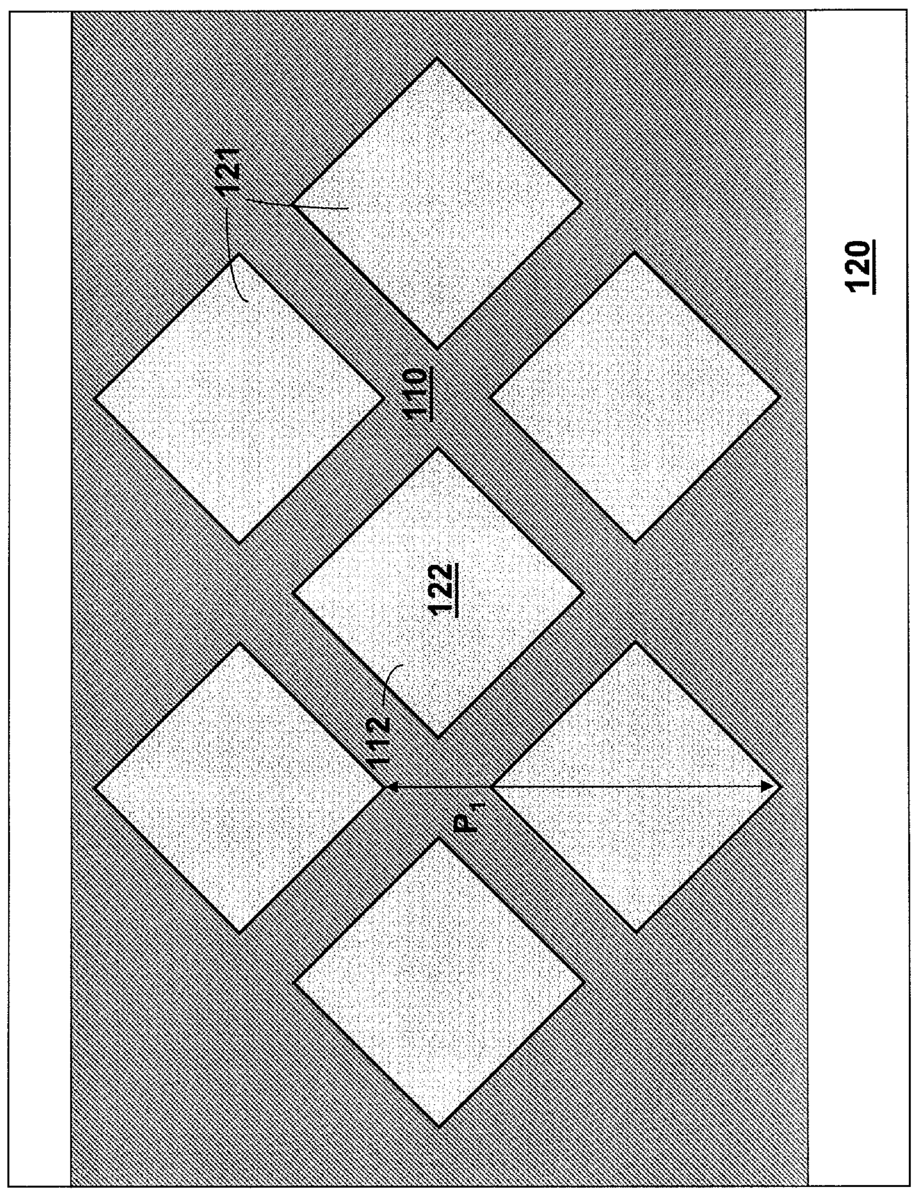

As shown in FIG. 1C, the photoresist material 120 is exposed to light during a first exposure step. First portions 122 of the photoresist material 120 visible through the apertures 112 are formed into a first pattern 121 that is non-removable by a later step in which the photoresist material 120 is treated, for example, by a solvent. The pitch of the first portions 122 is shown as $P_1$.

Figure 1D:
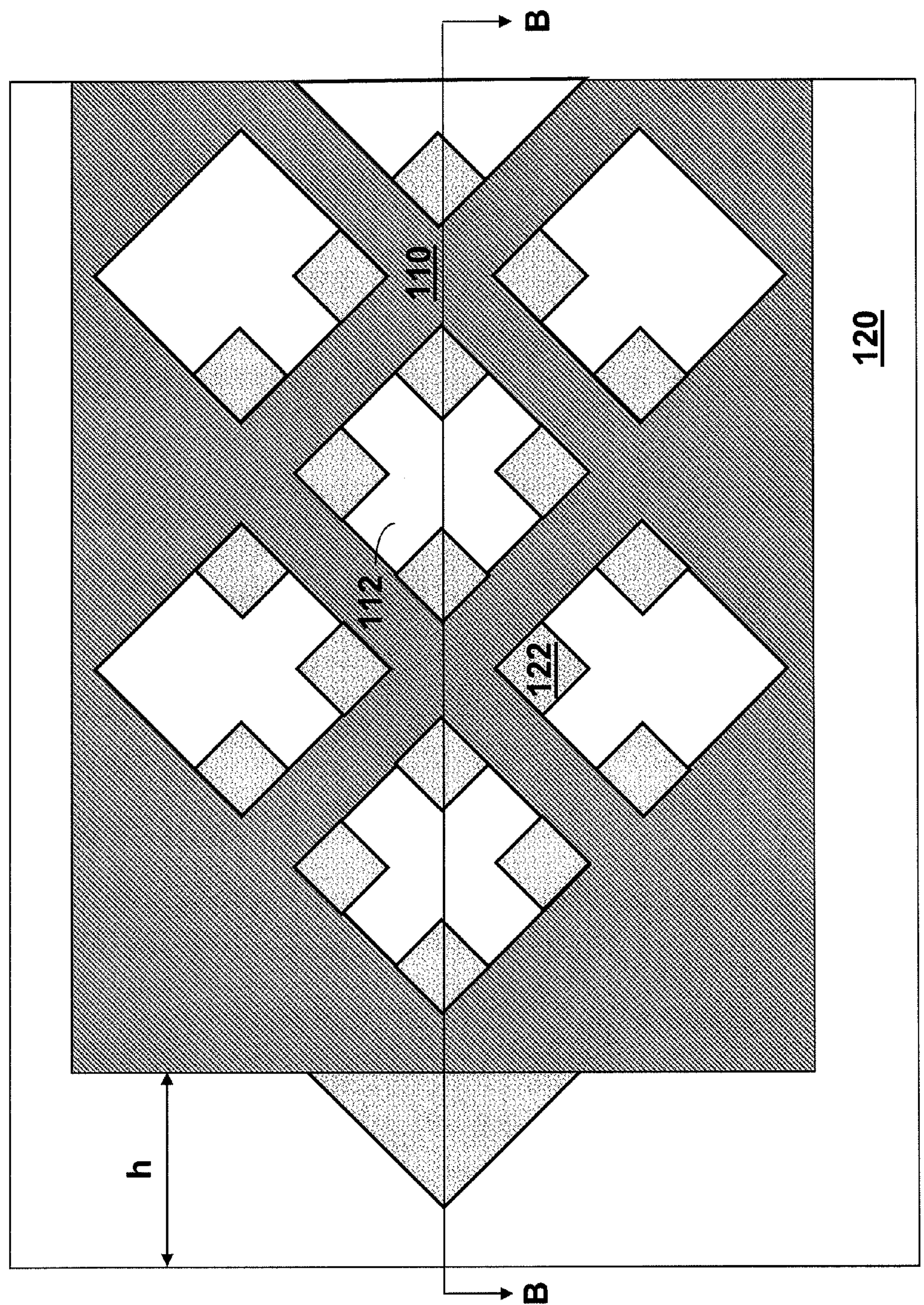
Figure 1E:
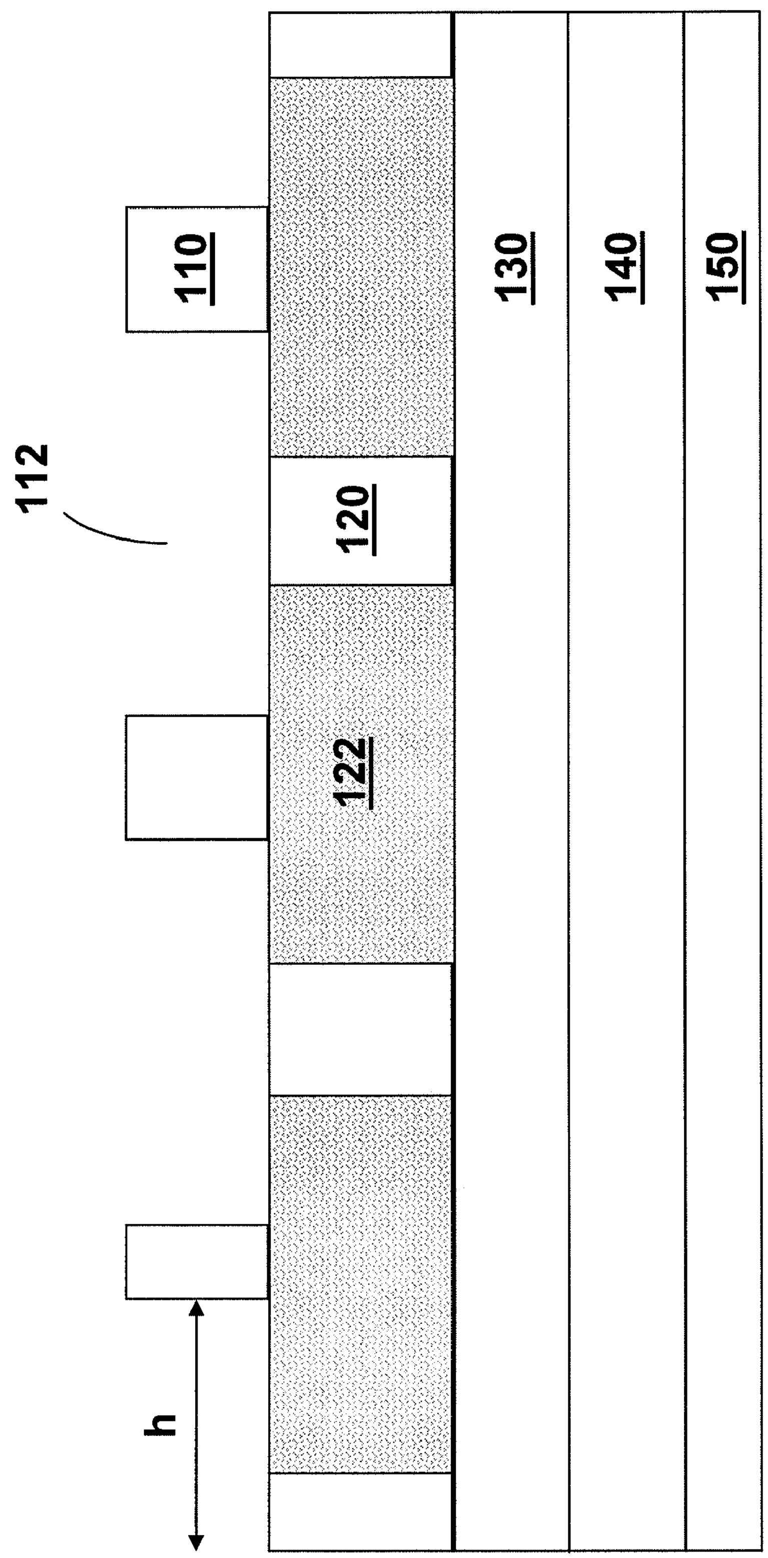

As shown in the top down view of FIG. 1D and the cross-sectional view taken along line B-B of FIG. 1E, the mask 110 is shifted relative to the first pattern 121 so that the apertures 112 in the mask 110 overlap some part of the first portions 122 of the first pattern 121. In the embodiment shown in FIGS. 1D and 1E, the mask 110 is shifted to the right relative to the first pattern 121 by a distance h so that the center of each aperture 112 is aligned at, or approximately at, a location centered between four first portions 122. In various embodiments, the distance and direction of h may be varied depending on the size and location of the vias desired. FIG. 1E shows a side view of the mask 110 after it has been shifted by the distance h.

Figure 1F:
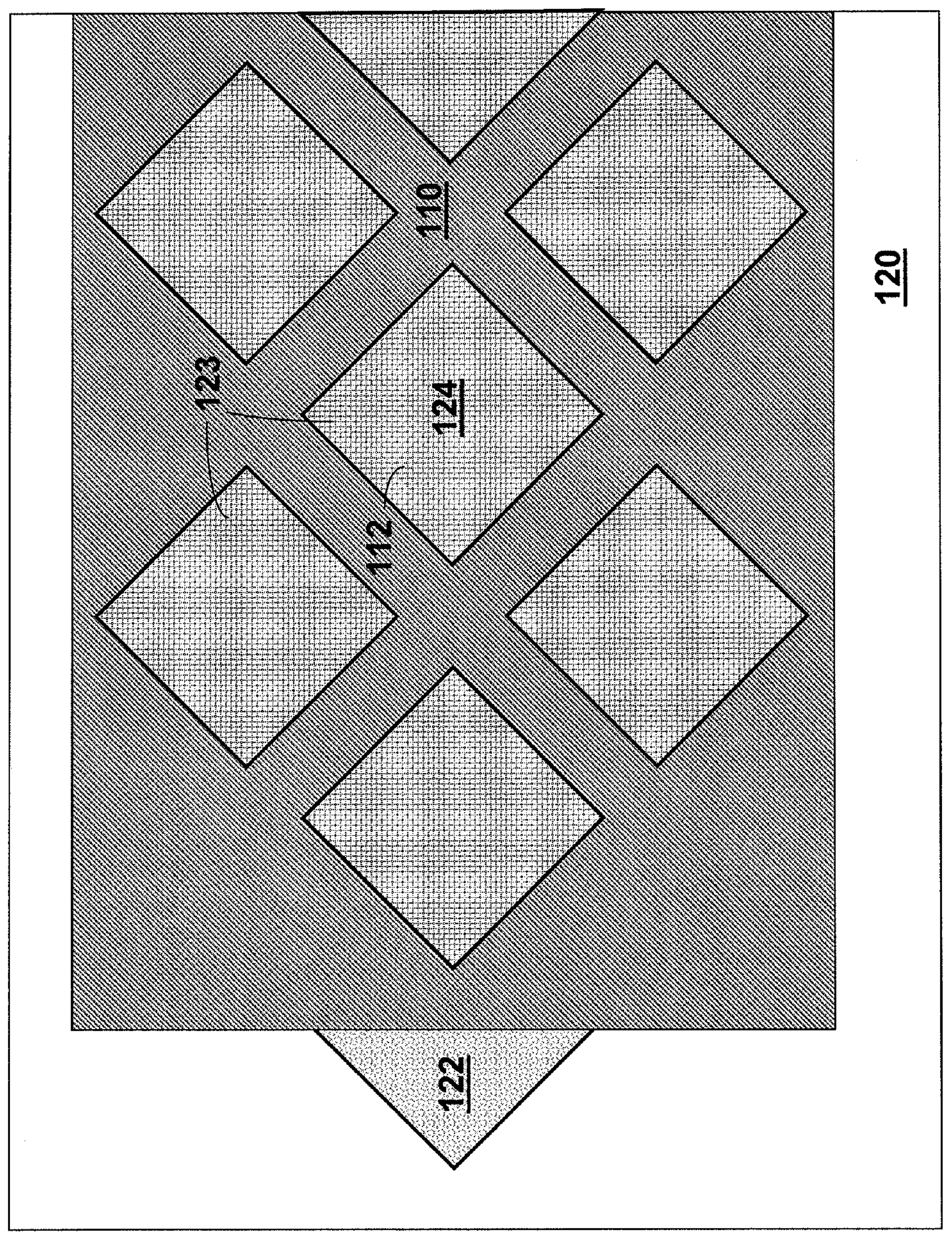

As shown in FIG. 1F, the photoresist material 120 is exposed to light during a second exposure step. The second portions 124 of the photoresist material 120 visible through the apertures 112 are formed into a second pattern 123 overlapping the first portions 122 of the first pattern 121. Like the first portions 122, the second portions 124 are non-removable by a later step in which the photoresist material 120 is treated, for example, by a solvent. The pitch of the second portions 124 is equal to the pitch of the first portions 122 since both portions 122, 124 are formed using the same mask 110.

Figure 1G:
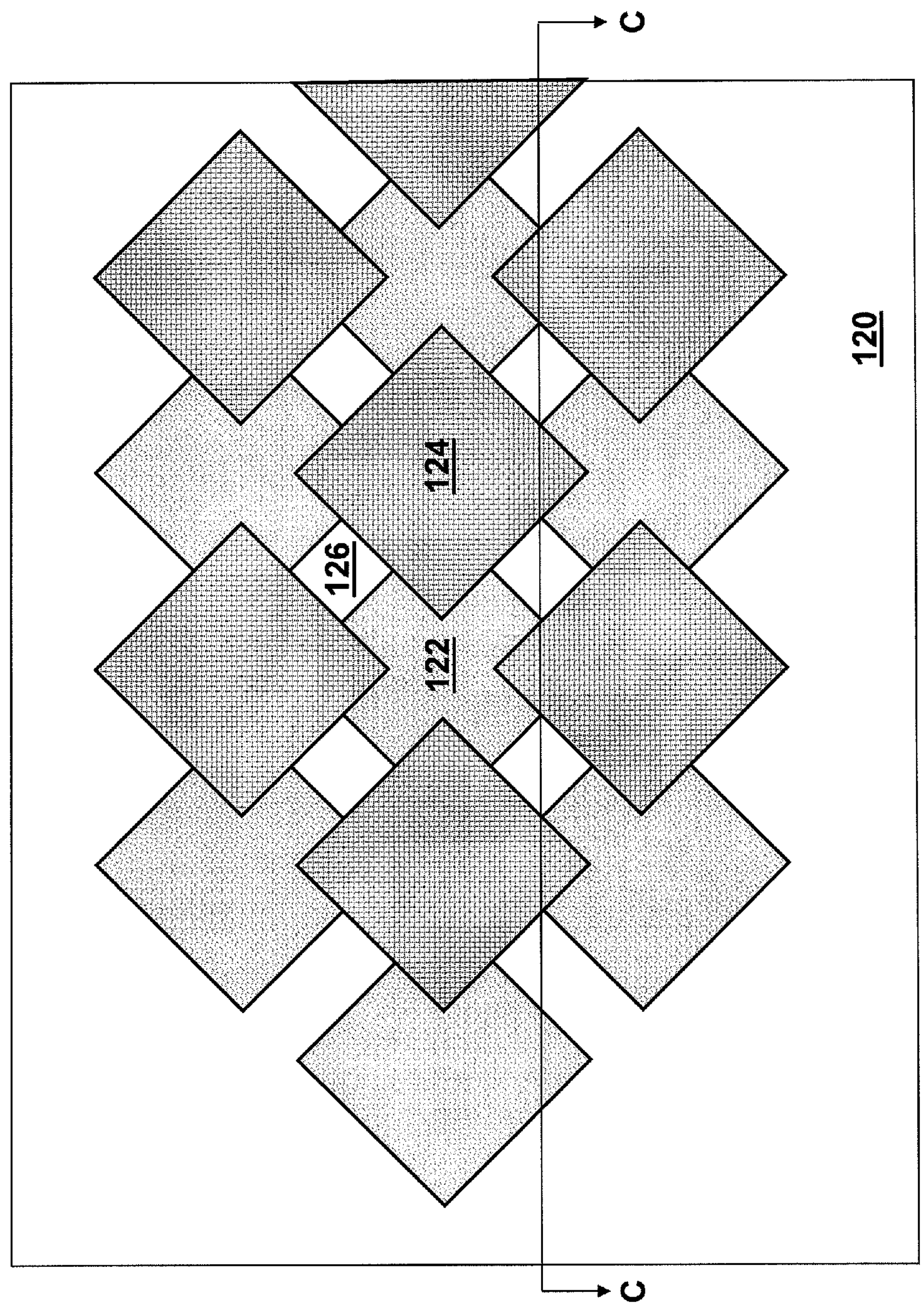
Figure 1H:
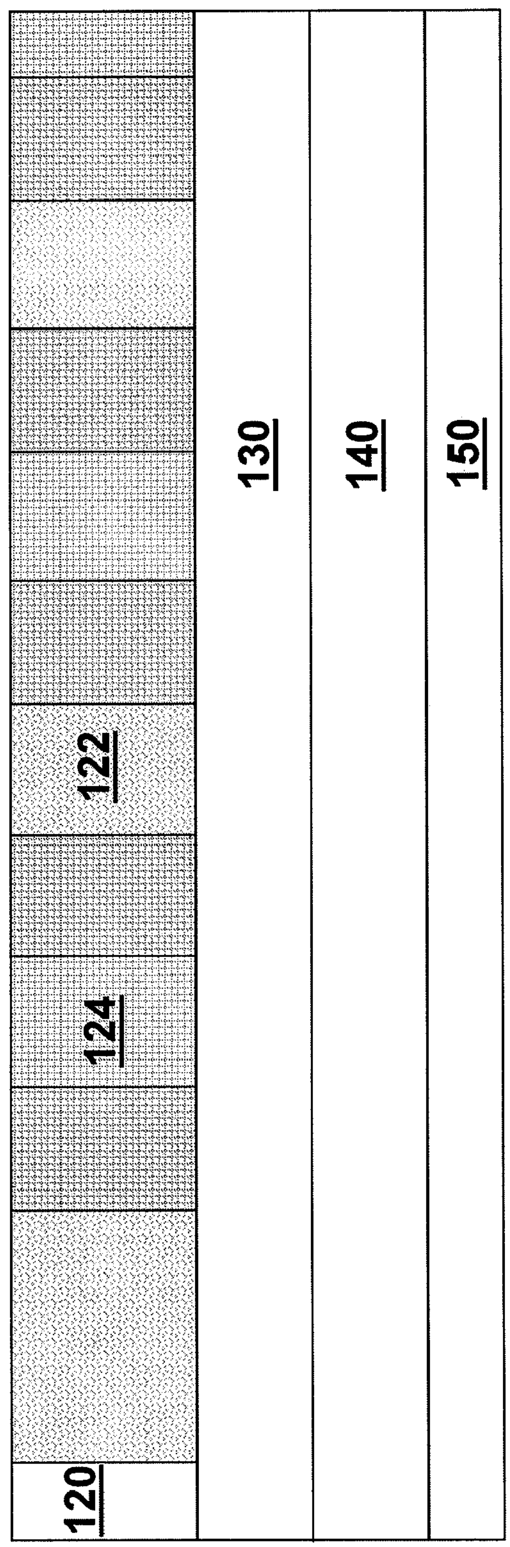
Figure 1I:
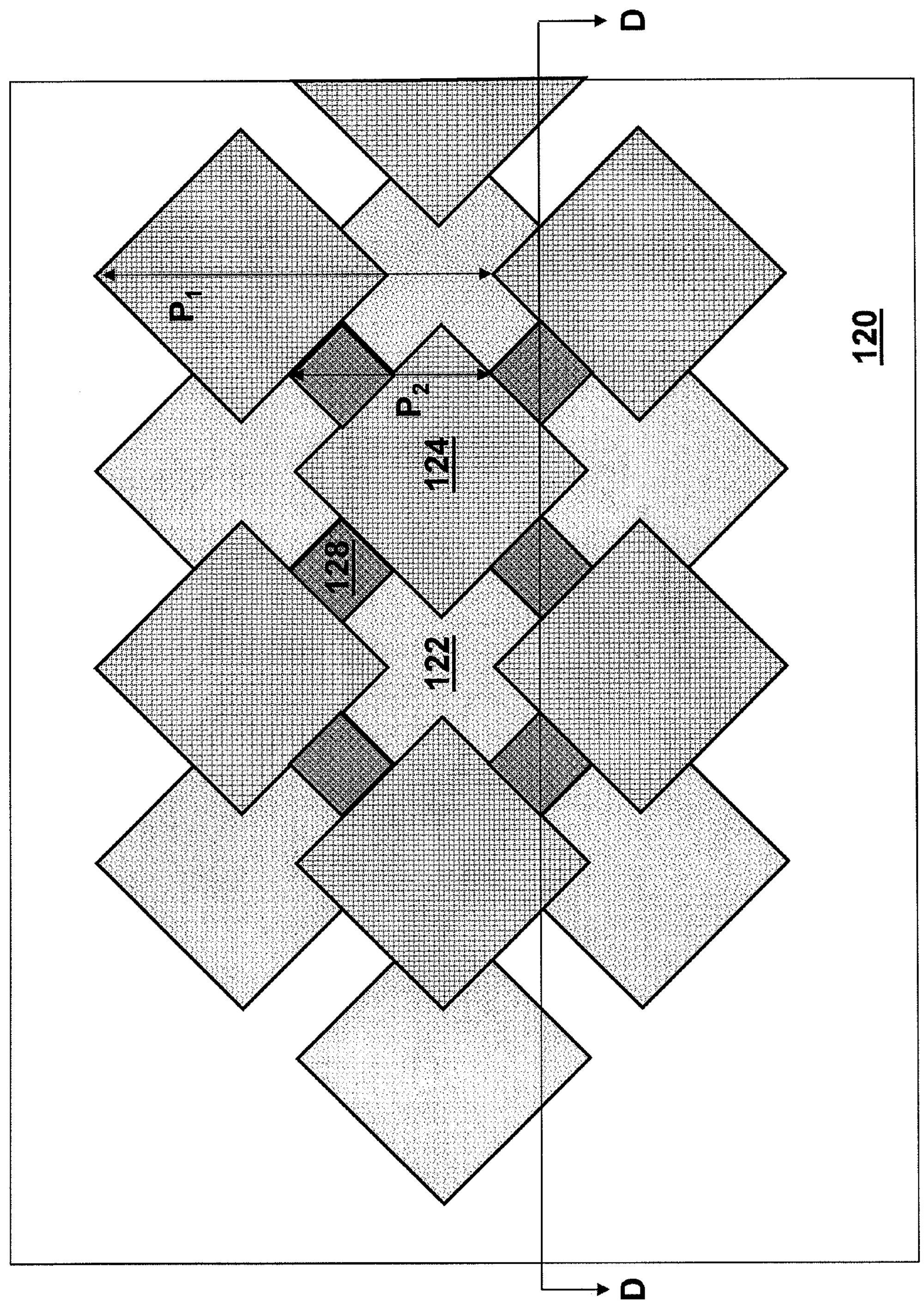
Figure 1J:
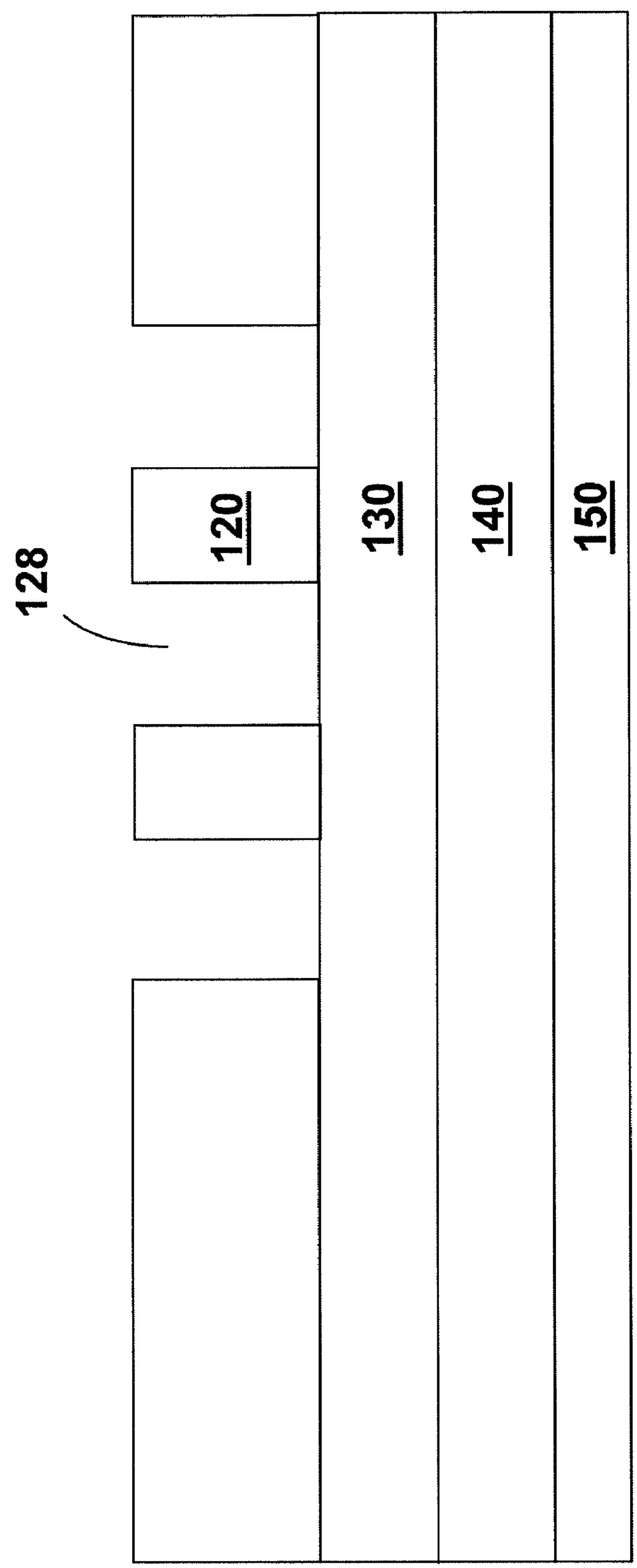

As shown in the top down view of FIG. 1G and the cross-sectional views taken along line C-C of FIG. 1H, the mask 110 is removed from the photoresist material 120. The unexposed portions 126 of the photoresist material 120 arranged between the first portions 122 and second portions 124 are removable and form the footprints for the area to be etched into the vias. As shown in the top down view of FIG. 1I and the cross-sectional view taken along line D-D of FIG. 1J, the unexposed portions 126 (FIG. 1G) of the photoresist 120 are removed using methods known in the art, such as treating with a solvent, to form openings 128 in the photoresist 120. The pitch of the openings 128, which is the same as the pitch of the vias 132 (FIG. 1K) to be formed in the insulating material 130, is shown as $P_2$.

Figure 1K:
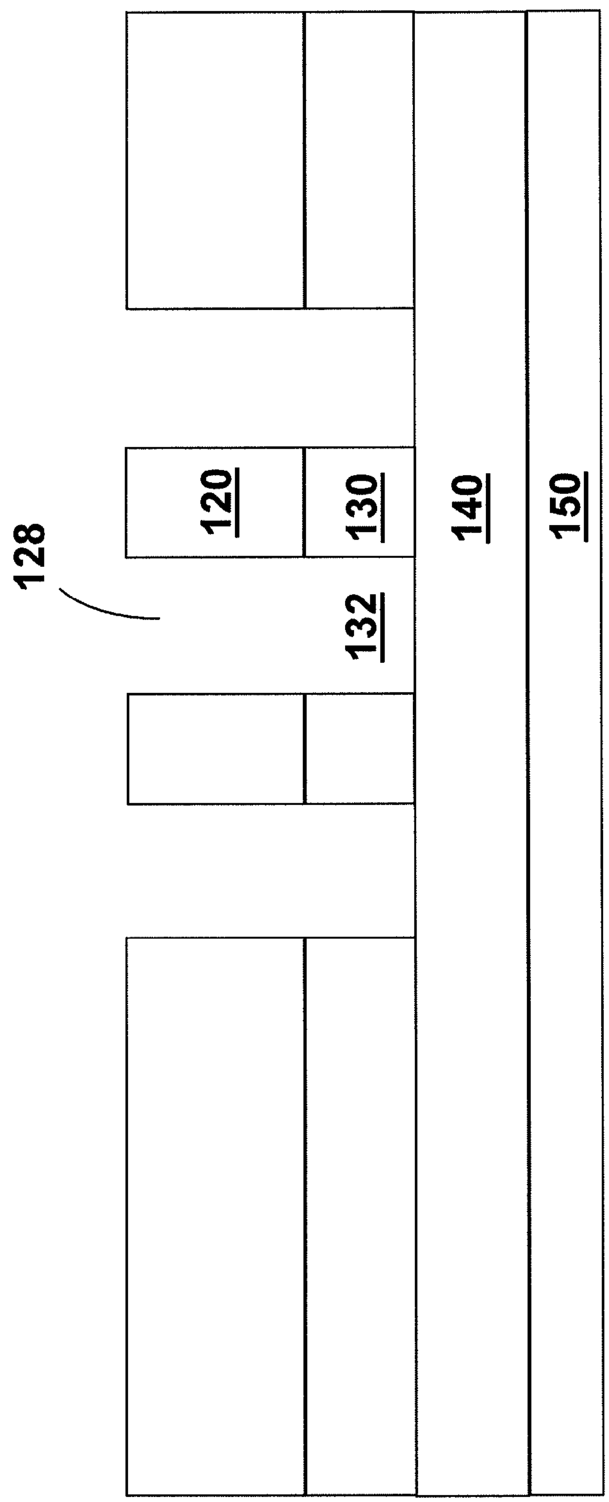
Figure 1L:
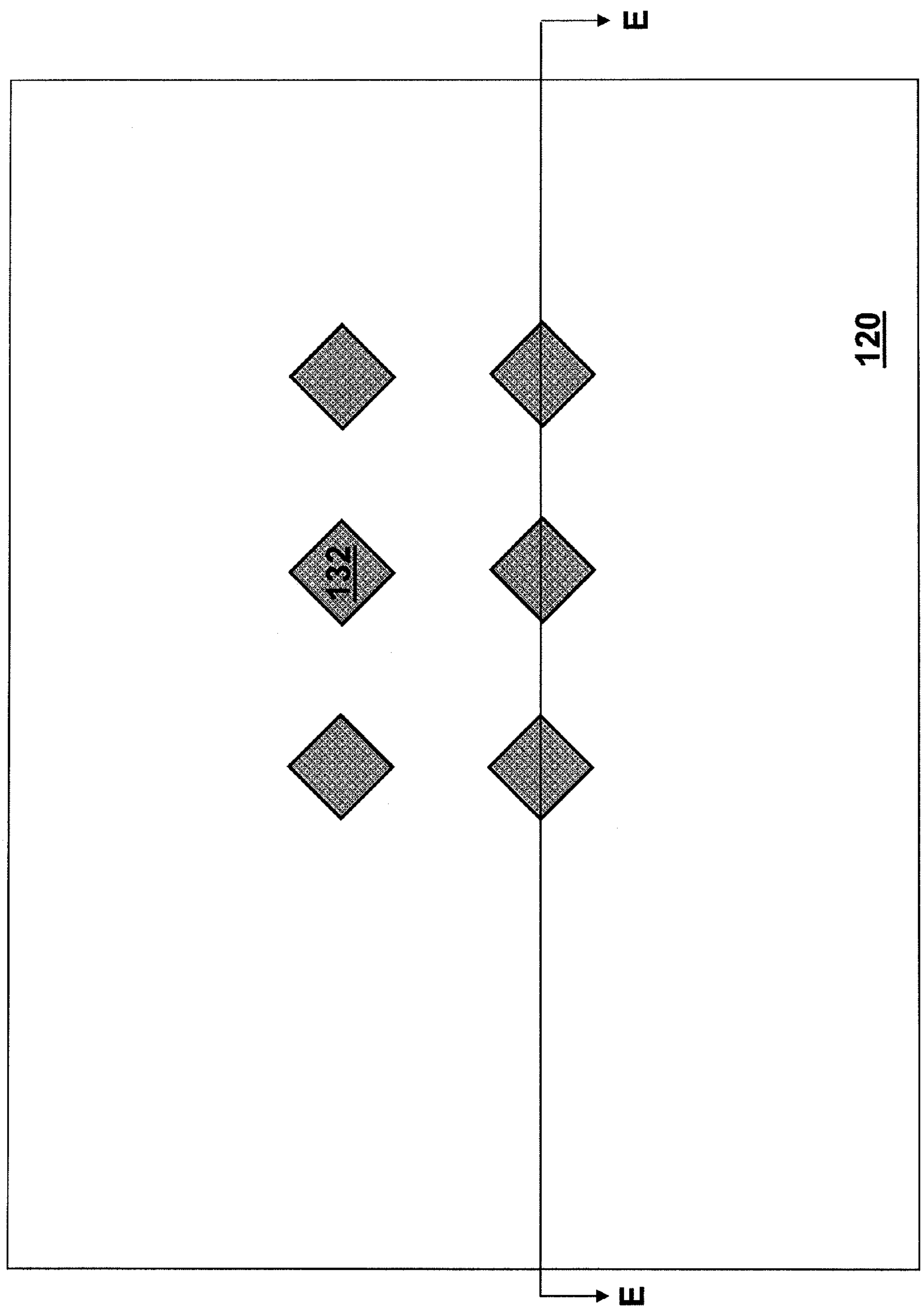
Figure 1M:
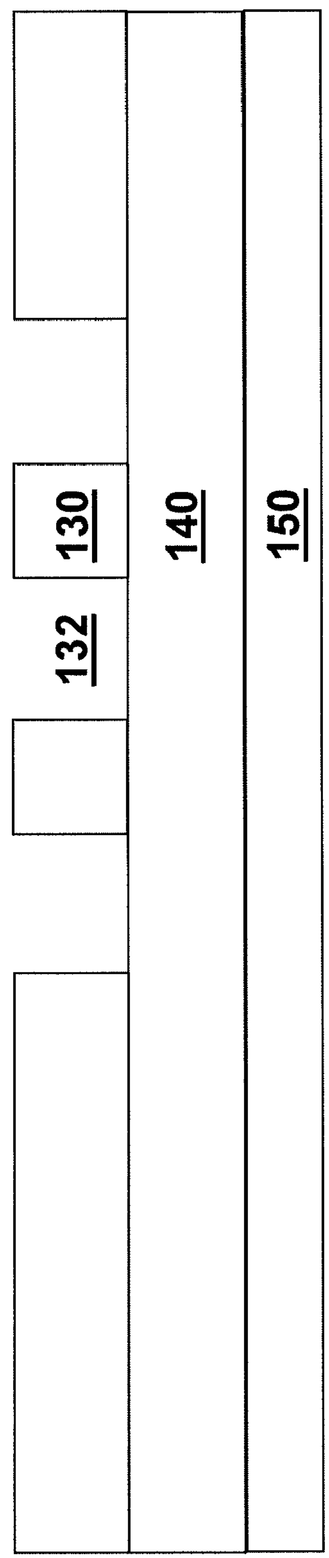

As shown in FIG. 1K, the insulating material 130 is etched using the remaining photoresist material 120 as a mask using either a wet or dry chemical etch to form the vias 132 and expose the conductive material 140. As shown in the top down view of FIG. 1L and the cross-sectional view taken along line E-E of FIG. 1M, the remaining photoresist 120 is removed from the insulating material 130 having a plurality of vias 132 formed therein. The vias 132 may then be filled with conductive material as is known in the art to form electrical connections. Additional conductive materials or other features may be formed over the electrical connections.

The method and mask 110 shown in FIGS. 1A-1M makes use of a pitch root (1.41) multiplication factor rather than a pitch double factor due to the geometric pattern used. In a pitch root multiplication factor of 1.41, the pitch of a point of an aperture 112 measured diagonally across the square shape is 1.41 times the pitch of a point of a square shape measured along an edge of the square shape. As shown in FIGS. 1A-1M, the apertures 112 may be at or about 2.82 times the size of the vias 130. In another embodiment, the apertures 112 could be shifted by 30 degrees to yield a pitch root multiplication factor that is the square root of 3 divided by the square root of 2. Other types of pitch root geometry could also be used to benefit from the pitch reduction.

Figure 2A:
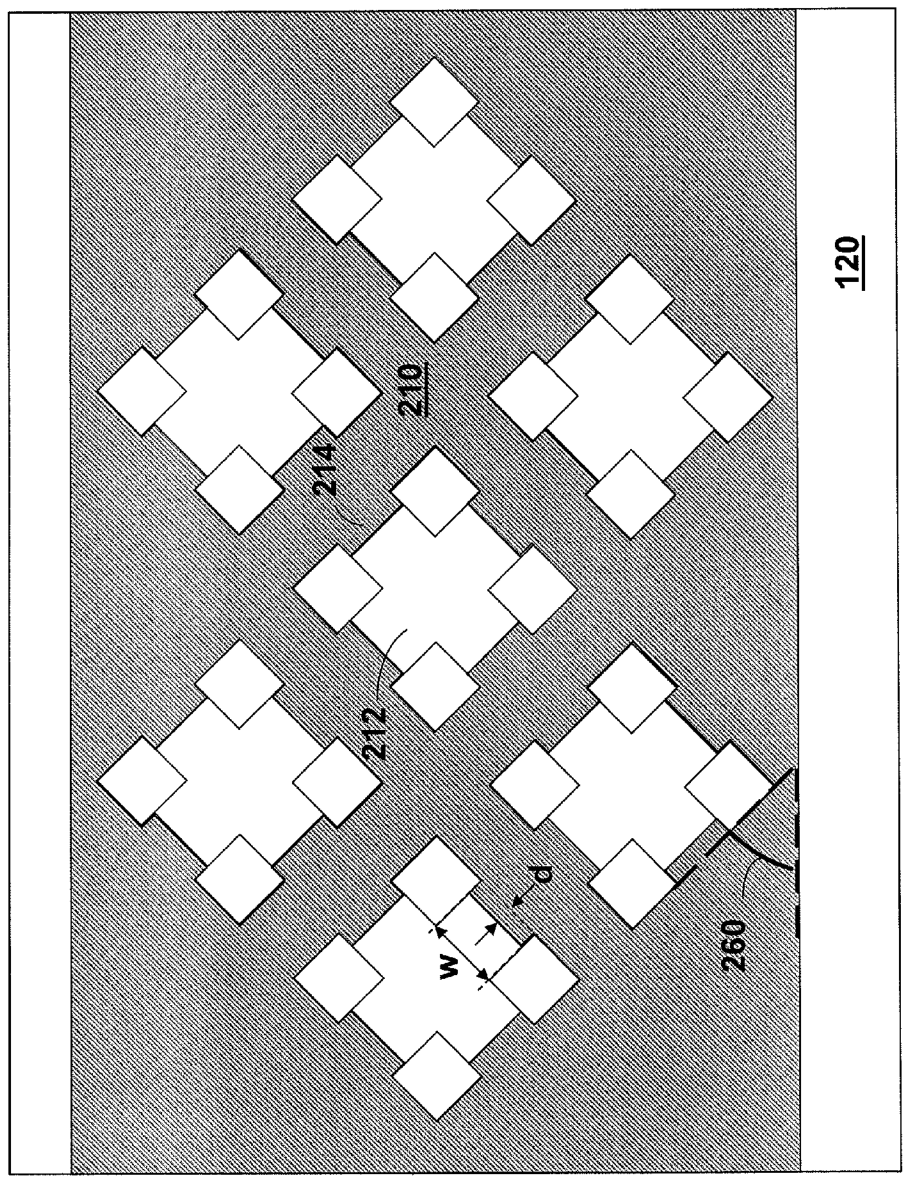
FIGS. 2A through 2F illustrate steps in a photolithographic method of forming vias in a substrate according to another embodiment described herein.

FIGS. 2A-2F show steps in a method of making a grid of vias according to another embodiment described herein. FIG. 2A illustrates a top down view of a mask 210 arranged over a stack of materials, similar to the stack shown in FIG. 1B, which includes a substrate 150, a conductive material 140, such as a metal or a metal silicide, an insulating material 130, such as an oxide, and a negative photoresist material 120, such as SU-8. It should be understood that the materials described in FIG. 2A are examples only and the stack could include any number of different materials used in the production of an integrated circuit.

The mask 210 includes a plurality of apertures 212 formed therein. In the embodiment shown in FIG. 2A, the apertures 212 are arranged as a grid of squares having an additional rectangular carve out 214 in each side of the squares. Another way to describe the shape of the apertures 212 is to describe them as a series of five overlapping squares, i.e., one large square with four smaller squares, each overlapping a corner of the larger square. In various embodiments, the width w and depth d of the carve out 214 may be modified to modify the shape of the via 232 to be formed. Furthermore, the mask 210 may include any number of apertures 212 arranged into various groups to produce a desired number of contacts on a single integrated circuit or on a number of integrated circuits arranged on a die. Furthermore, although the aperture grid shown in FIG. 2A is arranged at a forty-five degree angle 260 with reference to the mask 210, in other embodiments, the grid may be rotated to other angles. The apertures 212 may be squarely aligned with each other in the grid pattern, as shown in FIG. 2A, or may be arranged at a different angle to each other. In various embodiments, the apertures 212 may be formed of a number of shapes other than squares, such as circles, triangles, and other polyhedrons and combinations thereof, including shapes having straight and curved lines.

Figure 2B:
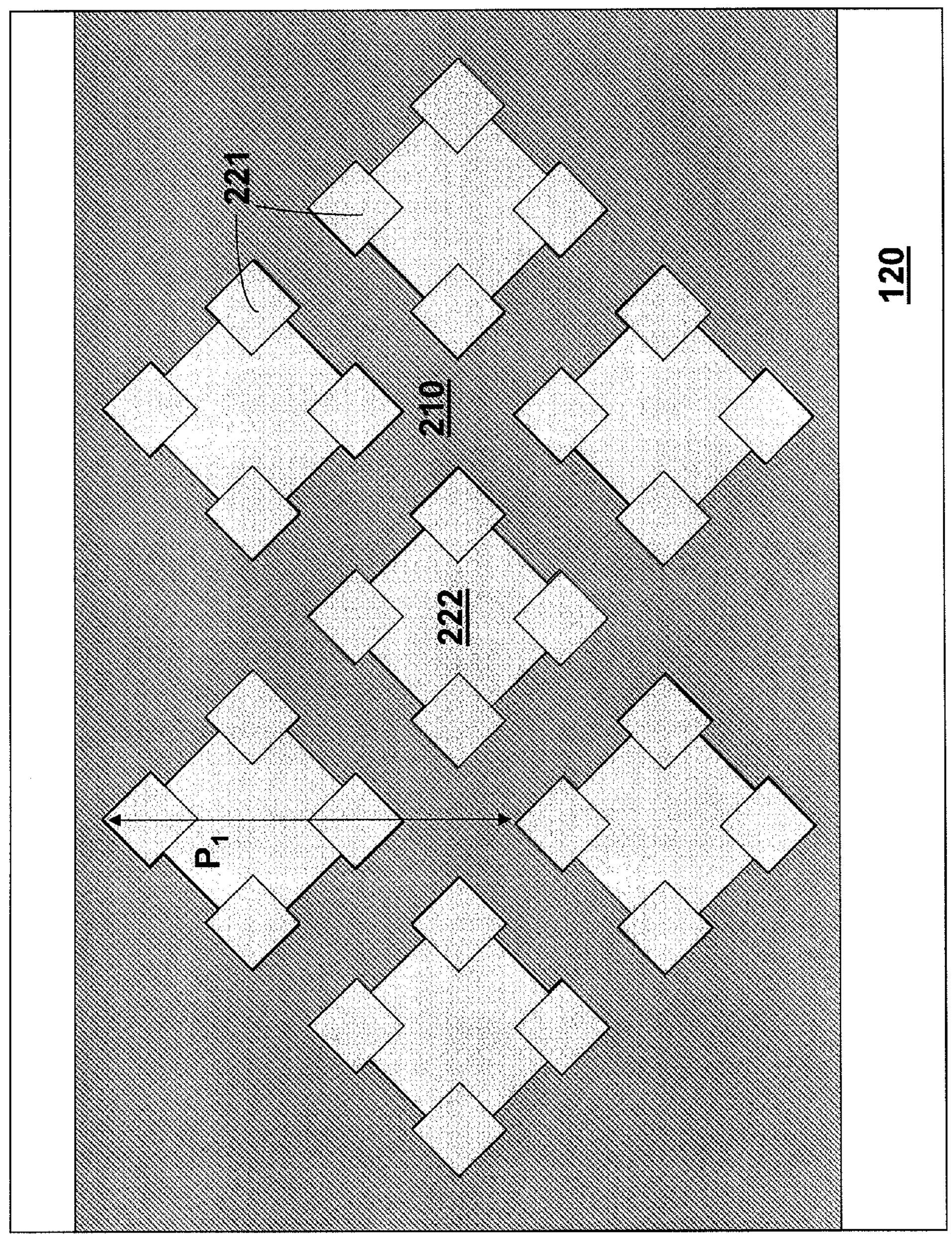
Figure 2C:
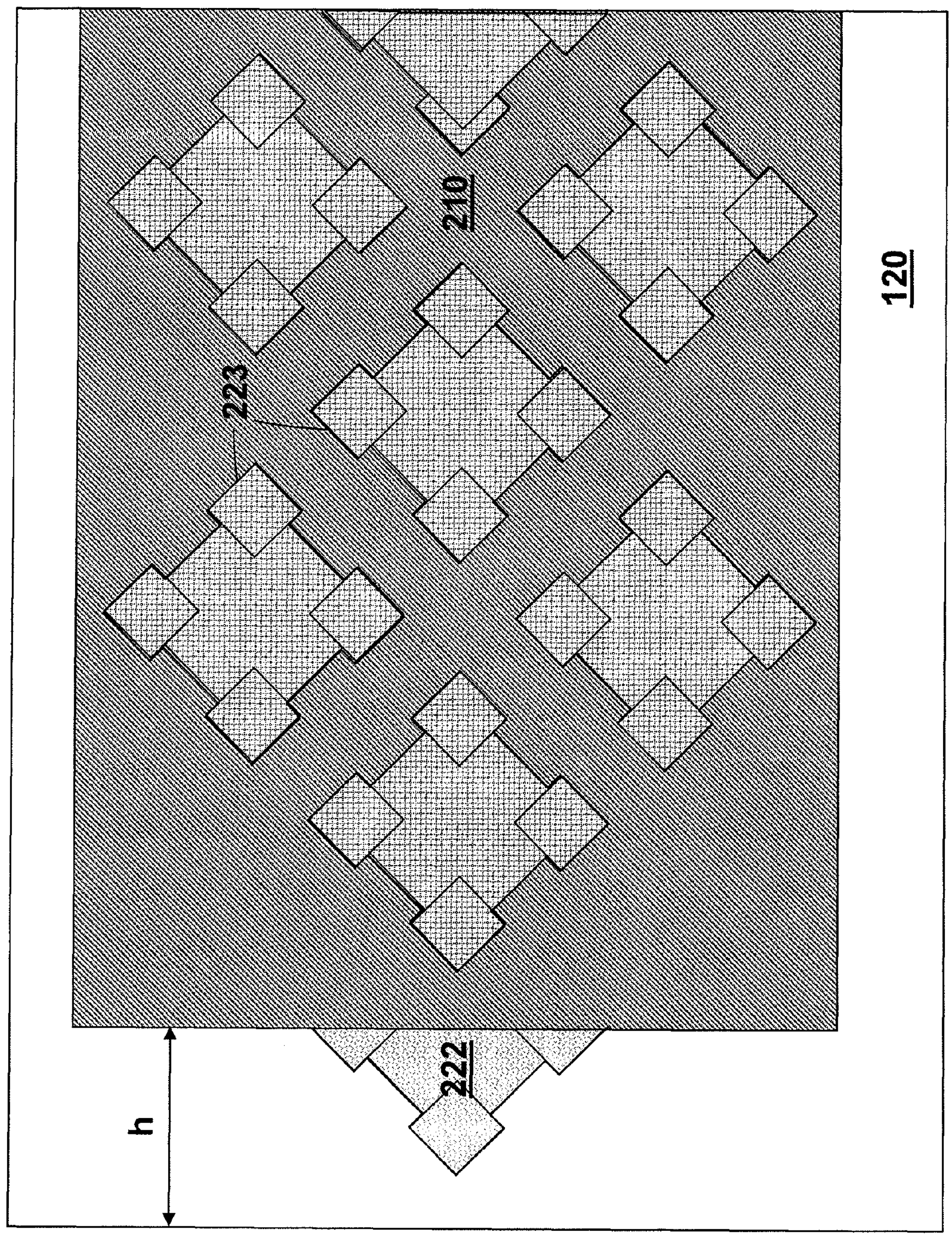

As shown in FIG. 2B, the photoresist material 120 is exposed to light during a first exposure step. First portions 222 of the photoresist material 120 visible through the apertures 212 are formed into a non-removable first pattern 221. The pitch of the first portions 222 is shown as $P_1$. As shown in FIG. 2C, the mask 210 is shifted to the right relative to the first pattern 221 by a distance h so that the center of each aperture 212 is aligned at, or approximately at, a location centered between four first portions 222. The photoresist material 120 is exposed to light again during a second exposure step to form non-removable second portions 224 of the photoresist material 120 visible through the apertures 212 into a second pattern 223 overlapping the first portions 222 of the first pattern 221. The pitch of the second portions 224 is equal to the pitch of the first portions 222 since both portions are formed using the same mask 210.

Figure 2D:
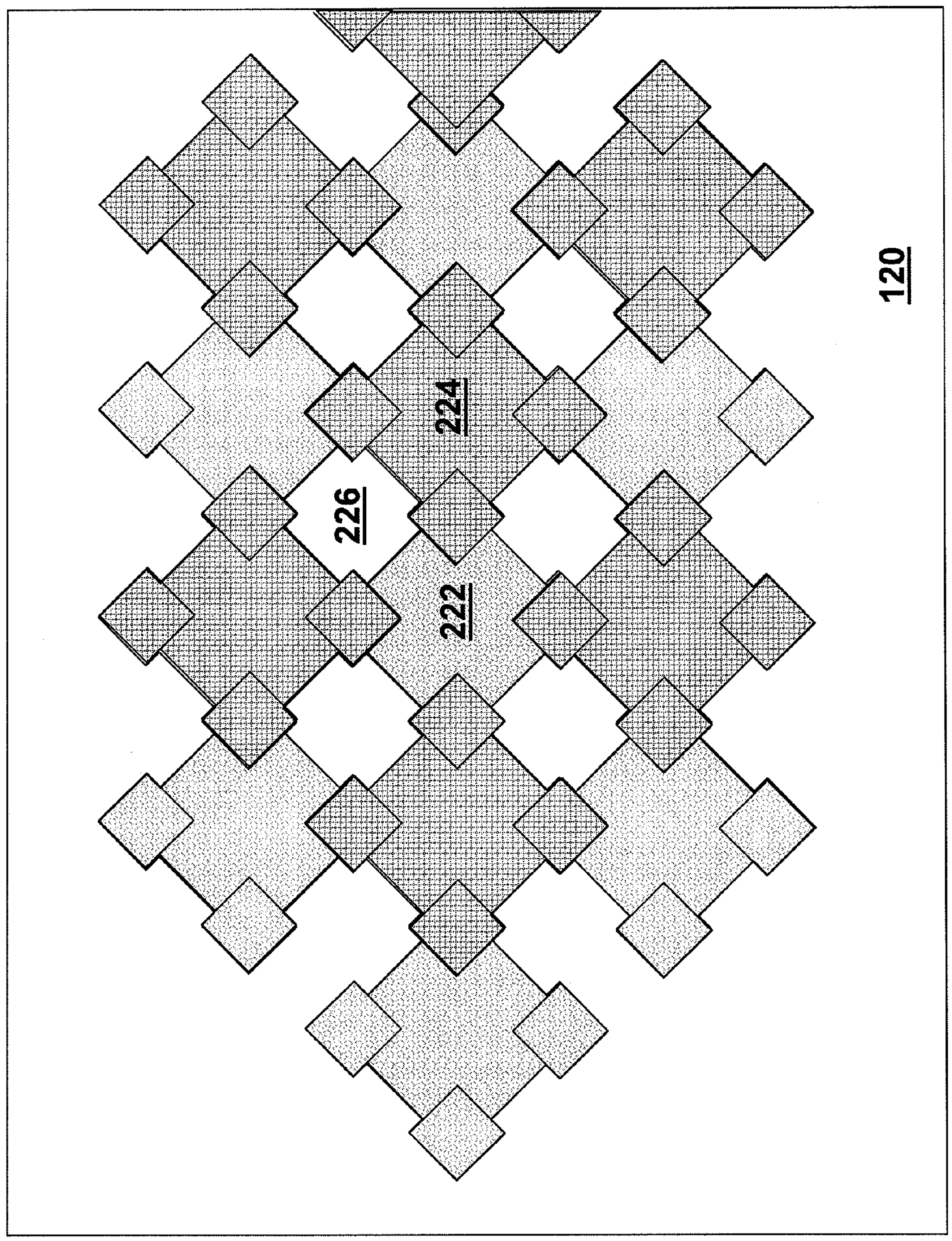
Figure 2E:
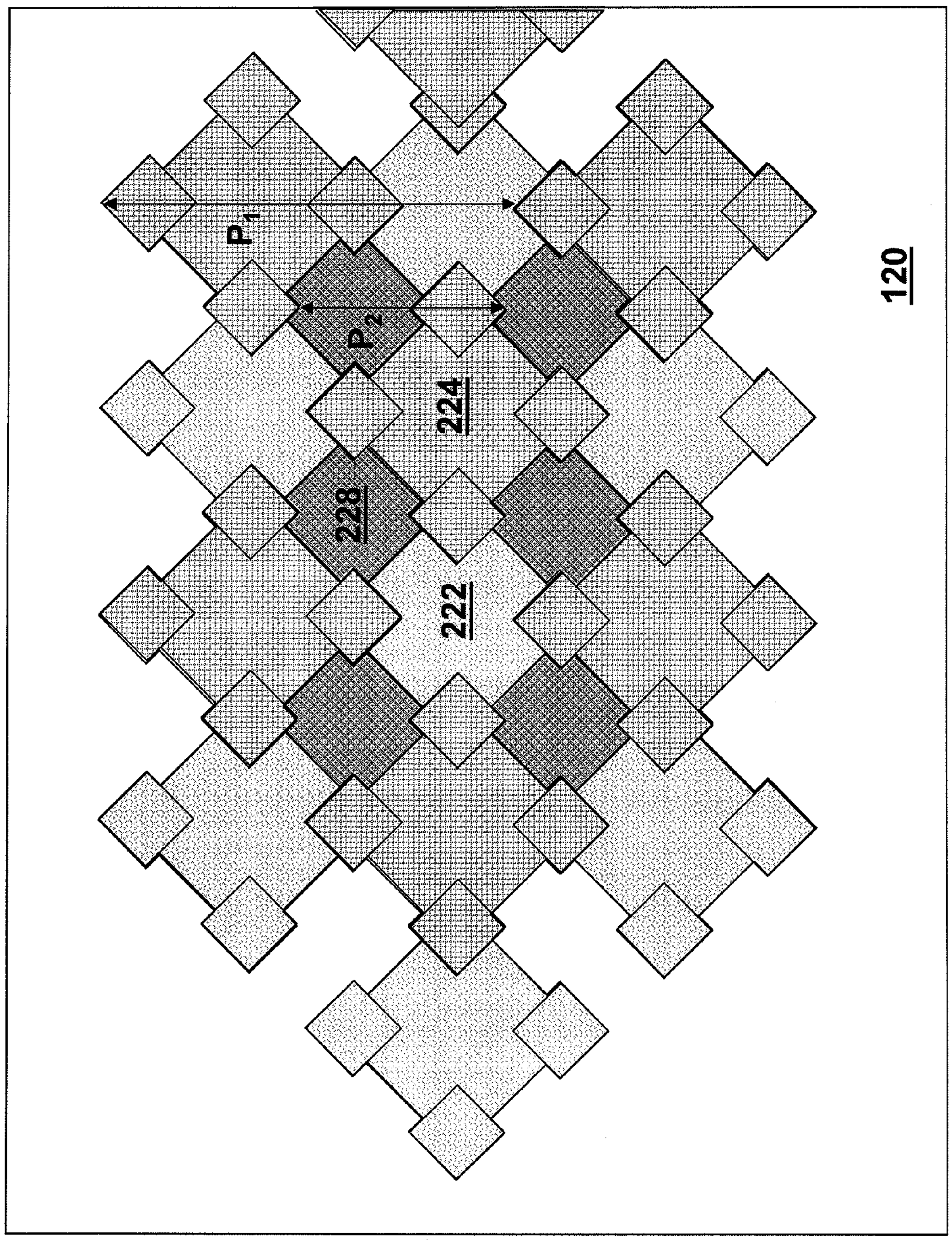

As shown in FIG. 2D, the mask 210 is removed from the photoresist material 120. The removable unexposed portions 226 of the photoresist material 120 arranged between the first portions 222 and second portions 224 form the footprints for the area to be etched into vias. As shown in FIG. 2E, the unexposed portions 226 of the photoresist 120 are removed using methods known in the art to form openings 228 in the photoresist 120. The pitch of the openings 228, which is the same as the pitch of the vias 231, is shown as $P_2$.

Figure 2F:
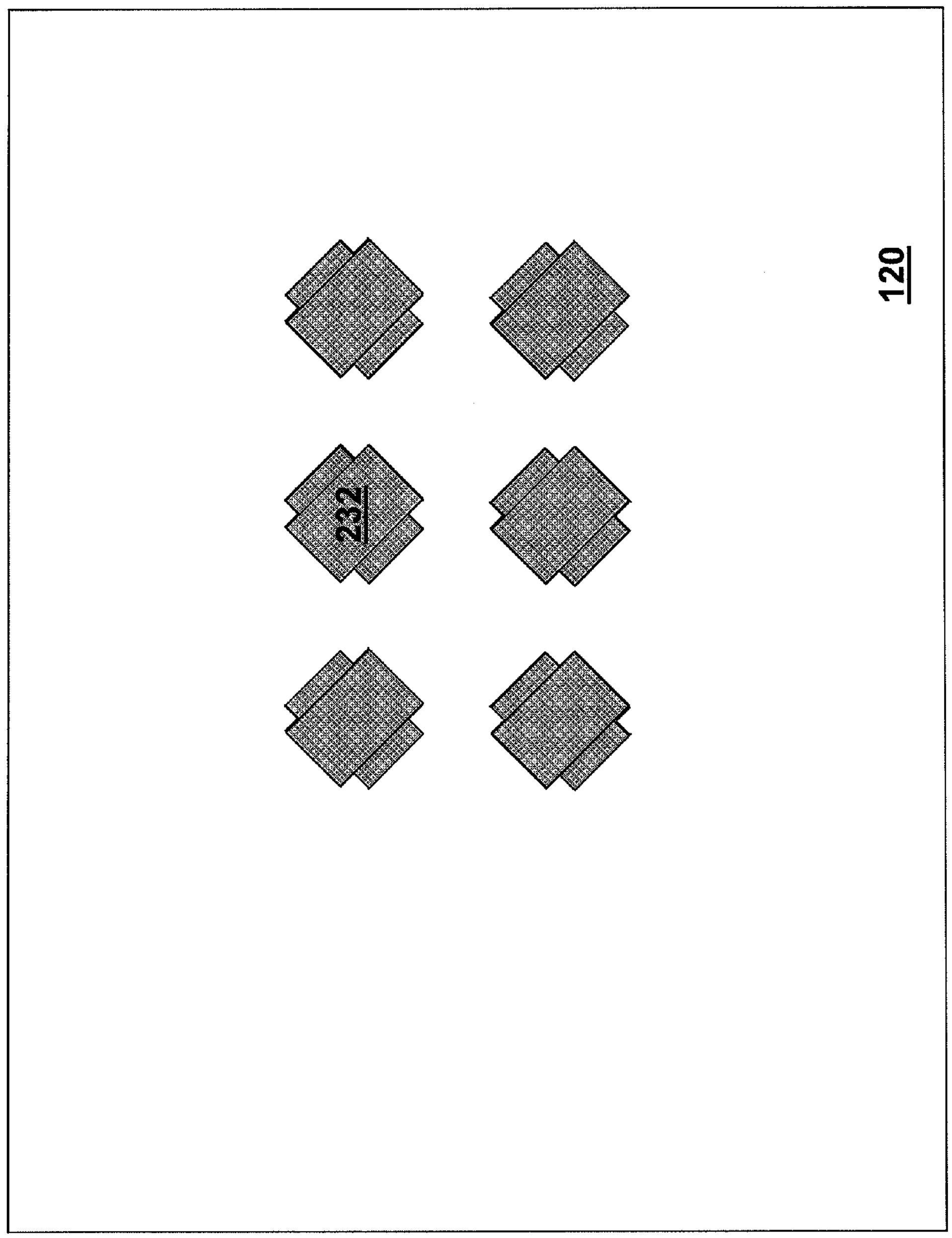

As shown in FIG. 2F, the insulating material 130 is etched through the remaining photoresist material 120 using either a wet or dry chemical etch to form the vias 232 and expose the conductive material 140. The remaining photoresist 120 is removed from the insulating material 130 having a plurality of vias 232 formed therein. The method and apparatus shown in FIGS. 2A-2F makes use of a pitch root (1.41) multiplication factor. Other types of pitch root geometry could also be used to benefit from the pitch reduction. By these methods a pattern of vias may be produced that are smaller than the inherent resolution limit of the mask used for the photolithographic technique.

The above description and drawings are only to be considered illustrative of specific embodiments, which achieve the features and advantages described herein. Modifications and substitutions for specific conditions and materials can be made. Accordingly, the embodiments are not considered as being limited by the foregoing description and drawings, but is only limited by the scope of the appended claims.

The invention claimed is:

1. A method of forming an integrated circuit structure, the method comprising:

arranging a mask having a plurality of apertures over a first material;

making first portions of the first material non-removable by exposure through the plurality of apertures;

shifting the mask so that the plurality of apertures overlap a portion of the first portions of the first material; and making second portions of the first material non-removable by exposure through the plurality of apertures, wherein the first portions and the second portions overlap in such a way so as to produce removable portions of the first material arranged between the first portions and second portions; and removing the removable portions of the first material.

2. The method of claim 1, further comprising removing the removable portions to form a plurality of openings in the first material.

3. The method of claim 2, further comprising providing a second material below the first material and etching the second material through the openings in the first material to form a plurality of vias in second material.

4. The method of claim 3, further comprising forming electrical connections in the plurality of vias formed in the second material.

5. The method of claim 4, further comprising forming a conductive material over and in contact with at least one of the electrical connections.

6. The method of claim 1, wherein the first material is a photoresist material.

7. The method of claim 6, wherein formation of the first portions of the first material comprises exposing the first portions of the first material to radiation and formation of the second portions of the second material comprises exposing the second portions of the second material to radiation.

8. The method of claim 1, wherein the plurality of apertures are square shaped.

9. The method of claim 8, wherein the plurality of apertures are arranged at a forty-five degree angle to an edge of the mask.

10. The method of claim 8, wherein the plurality of apertures are arranged in a grid.

11. The method of claim 10, wherein the mask is shifted by a distance such that the center of the apertures are aligned at or approximately at locations centered between four first portions.

12. The method of claim 10, wherein the plurality of apertures are arranged such that a pitch of a point of a square shape measured diagonally across the square shape is at or about 1.41 times the pitch of a point of a square shape measured along an edge of the square shape.

13. The method of claim 1, wherein the plurality of apertures are in the shape of a first square overlapped by four smaller squares, wherein each of the smaller square overlaps one of the corners of the first square.

14. The method of claim 13, wherein the plurality of apertures are arranged in a grid.

15. The method of claim 14, wherein the mask is shifted by a distance such that the center of the apertures are aligned at or approximately at locations centered between four cured first portions.

16. The method of claim 14, wherein the plurality of apertures are arranged such that a pitch of a point of a smaller square measured diagonally across the aperture is at or about 1.41 times the pitch of a point of a smaller square measured along an edge of the aperture.

17. A method of forming electrical connections in an integrated circuit, the method comprising:

providing a material to be patterned over a substrate;

providing a photoresist material over the material to be patterned;

providing a mask having a plurality of apertures over the photoresist material;

exposing the photoresist material through the plurality of apertures during a first exposure to form non-removable first portions of the photoresist material;

shifting the mask so that the plurality of apertures overlap a portion of the first portions of the photoresist material;

exposing the photoresist material through the plurality of apertures during a second exposure to form non-removable second portions of the photoresist material;

removing removable portions of the photoresist located between the overlapping first portions and second portions of the photoresist;

etching the material to be patterned through areas previously occupied by the removable portions of the photoresist to form a plurality of openings.

18. The method of claim 17, wherein the openings are vias.

19. The method of claim 18, further comprising filling the vias with conductive material to form a plurality of electrical connections.

20. The method of claim 17, wherein the plurality of apertures comprise square shapes and are arranged in a grid.

21. The method of claim 20, wherein the plurality of apertures are arranged such that a pitch of a point of a square shape measured diagonally across the square shape is 1.41 times the pitch of a point of a square shape measured along an edge of the square shape.

22. The method of claim 20, wherein the plurality of apertures each comprise five overlapping square shapes.

23. A method of forming a mask, comprising:

changing a physical property a first material by irradiating the first material a first time through a mask having a plurality of apertures;

shifting the mask relative to the first material and irradiating the material a second time through the mask to change the physical property of the first material not changed by said first irradiating, and producing a mask from the first material by removing one of either portions of the first material having a changed physical property or portions of the first material which do not have a changed physical property.

24. The method of claim 23, further comprising removing portions of the first material which do not have a changed physical property.

* * * * *